US00RE40043E

(19) United States
(12) Reissued Patent
Kwan et al.

(10) Patent Number: US RE40,043 E
(45) Date of Reissued Patent: Feb. 5, 2008

(54) POSITIONING DEVICE HAVING TWO OBJECT HOLDERS

(75) Inventors: Yim-Bun Patrick Kwan, Aalen (DE); Gerrit Maarten Bonnema, Hengelo (NL); Erik Roelof Loopstra, Heeze (NL); Harmen Klaas Van Der Schoot, Vught (NL); Gerjan Peter Veldhuis, Vinkel (NL)

(73) Assignee: ASML Netherlands B.V., Veldhoven (NL)

(21) Appl. No.: 10/347,491
(22) PCT Filed: Feb. 27, 1998
(86) PCT No.: PCT/IB98/00254

§ 371 (c)(1),
(2), (4) Date: Oct. 29, 1998

(87) PCT Pub. No.: WO98/40791

PCT Pub. Date: Sep. 17, 1998

Related U.S. Patent Documents

Reissue of:
(64) Patent No.: 6,262,796
Issued: Jul. 17, 2001
Appl. No.: 09/180,011
Filed: Oct. 29, 1998

(30) Foreign Application Priority Data

Mar. 10, 1997 (EP) ..... 97200706

(51) Int. Cl.
*G03B 27/42* (2006.01)
*G03B 11/00* (2006.01)

(52) U.S. Cl. ..... 355/53; 356/401
(58) Field of Classification Search ..... 355/53, 355/55, 75, 72; 356/399, 400, 401; 396/624, 396/611; 310/12; 318/687
See application file for complete search history.

(56) References Cited

U.S. PATENT DOCUMENTS 3,679,874 A 7/1972 Fickenscher
4,768,064 A 8/1988 Isohata et al.

(Continued)

FOREIGN PATENT DOCUMENTS

EP 0 498 496 8/1992

(Continued)

*Primary Examiner*—Peter B. Kim
(74) *Attorney, Agent, or Firm*—Pillsbury Winthrop Shaw Pittman LLP

(57) ABSTRACT

A positioning device has first and second object holders that are guided over a guiding surface extending parallel to an X-direction and parallel to a Y-direction perpendicular to the X-direction and which are displaceable over the guiding surface from a first position into a second position by means of a displacement system. The displacement system includes a first displacement unit and a second displacement unit to which the object holders can be alternately coupled. The first displacement unit is suitable for carrying out a first series of positioning steps of the first object holder in the first position and for displacing the first object holder from the first position into an intermediate position between the first and second positions. The second displacement unit is suitable for carrying out a second series of positioning steps of the second object holder in the second position, simultaneously with and independently of the first displacement unit, and for displacing the second object holder from the second position into the intermediate position. In the intermediate position, the object holders are exchanged, after which the first series of positioning steps can be carried out by the first displacement unit with the second object holder in the first position and the second series of positioning steps can be carried out by the second displacement unit with the first object holder in the second position. The positioning device is suitable for use in a lithographic device to carry out an exposure process with a first semiconductor substrate in an exposure position and, simultaneously therewith and independently thereof, a characterization process with a second semiconductor substrate in a characterization position.

15 Claims, 4 Drawing Sheets

U.S. PATENT DOCUMENTS

| | | | | | |
|---|---|---|---|---|---|
| 5,073,912 | A | | 12/1991 | Kobayashi et al. | |
| 5,208,497 | A | | 5/1993 | Ishii et al. | |
| 5,715,064 | A | * | 2/1998 | Lin | 356/401 |
| 5,763,966 | A | | 6/1998 | Hinds | |
| 5,826,129 | A | * | 10/1998 | Hasebe et al. | 396/611 |
| 5,969,441 | A | * | 10/1999 | Loopstra et al. | 310/12 |
| 6,027,262 | A | * | 2/2000 | Akimoto | 396/611 |
| 6,262,796 | B1 | * | 7/2001 | Loopstra et al. | 355/53 |

FOREIGN PATENT DOCUMENTS

| | | |
|---|---|---|
| EP | 0 525 872 | 2/1993 |
| EP | 0 687 957 | 12/1995 |
| GB | 2 155 201 | 9/1985 |
| GB | 2 290 658 | 1/1996 |
| JP | 3-273607 | 12/1991 |

* cited by examiner

POSITIONING DEVICE HAVING TWO OBJECT HOLDERS

Matter enclosed in heavy brackets [ ] appears in the original patent but forms no part of this reissue specification; matter printed in italics indicates the additions made by reissue.

BACKGROUND OF THE INVENTION

The invention relates to a positioning device having a guiding surface extending parallel to an X-direction and parallel to a Y-direction, a first object holder and a second object holder which are each guided over the guiding surface and are each displaceable parallel to the X-direction and parallel to the Y-direction from a first position into a second position, and a displacement system for displacing the first object holder and the second object holder over the guiding surface.

The invention further relates to a lithographic device provided with a radiation source, a mask holder, a focusing unit having a main axis, a characterization unit, and a positioning device, said positioning device comprising a guiding surface extending parallel to an X-direction, which is perpendicular to the main axis, and parallel to a Y-direction, which is perpendicular to the X-direction and the main axis, a first substrate holder and a second substrate holder which are each guided over the guiding surface and are each displaceable parallel to the X-direction and parallel to the Y-direction from a first position into a second position which is present near the focusing unit, and a displacement system for displacing the first substrate holder and the second substrate holder over the guiding surface.

A positioning device and a lithographic device of the kinds mentioned in the opening paragraphs are known from EP-A-0 687 957. The known lithographic device is used for the exposure of semiconductor substrates in the manufacturing process of integrated semiconductor circuits and operates according to the so-called step-and-repeat process. The known positioning device is used in the known lithographic device for displacing semiconductor substrates relative to the focusing unit and relative to the characterization unit. The first position of the known positioning device is a load and unload position in which a semiconductor substrate can be loaded on or unloaded from the first or the second object holder. The second position of the positioning device is an exposure position in which a semiconductor substrate present on the first or the second object holder can be exposed via the focusing unit. The first and the second object holder are displaceable from the first position to the second position and vice versa by the displacement system of the positioning device which is not described in detail in EP-A-0 687 957. When the first object holder is in the second position and the semiconductor substrate present thereon is being exposed, the second object holder is in the first position and a next semiconductor substrate is loaded thereon at first. Then the second object holder is displaced from the first position to a characterization position in which the semiconductor substrate present on the second object holder is characterized by the characterization unit. When the second object holder is in the characterization position, the first object holder and the second object holder are displaced lockstep-wise. In this manner the exposure of the semiconductor substrate present on the first object holder and the characterization of the semiconductor substrate present on the second object holder are carried out simultaneously, so that a high throughput of the step-and-repeat apparatus is obtained.

A disadvantage of the known positioning device and the known lithographic device is that the characterization of the semiconductor substrate present on the second object holder and the exposure of the semiconductor substrate present on the first object holder cannot be carried out independently from each other as a result of said lockstep-wise displacements of the first and the second object holder. As a result, the exposure of the semiconductor substrate present on the first object holder cannot be started until the second object holder has reached the characterization position.

SUMMARY OF THE INVENTION

It is an object of the present invention to provide a positioning device of the kind mentioned in the opening paragraph in which a first process involving a first series of positioning steps of the first object holder can be carried out simultaneously with and independently from a second process involving a second series of positioning steps of the second object holder, and in which also the first process can be carried out with the second object holder and, simultaneously and independently, the second process can be carried out with the first object holder.

It is a further object of the present invention to provide a lithographic device of the kind mentioned in the second paragraph in which a characterization process involving a first series of positioning steps of the first substrate holder can be carried out simultaneously with and independently from an exposure process involving a second series of positioning steps of the second substrate holder, and in which also the characterization process can be carried out with the second substrate holder and, simultaneously and independently, the exposure process can be carried out with the first substrate holder.

The positioning device according to the invention is for this purpose characterized in that the displacement system comprises a first displacement unit and a second displacement unit to which the first object holder and the second object holder can be coupled alternately, the first displacement unit being suitable for displacing the object holders from the first position into an intermediate position between the first position and the second position, and the second displacement unit being suitable for displacing the object holders from the intermediate position into the second position. As a result of the use of said first and second displacement units, a first process involving a first series of positioning steps of the first object holder can be carried out in the first position by means of the first displacement unit, and a second process involving a second series of positioning steps of the second object holder can be carried out in the second position by means of the second displacement unit simultaneously with and independently from the first process. When the first process and the second process have been completed, the first object holder is displaced by the first displacement unit from the first position into the intermediate position and the second object holder is displaced by the second displacement unit from the second position into the intermediate position. In the intermediate position, the first object holder is uncoupled from the first displacement unit and is coupled to the second displacement unit, while the second object holder is uncoupled from the second displacement unit and is coupled to the first displacement unit. Subsequently, the first object holder is displaced by the second displacement unit from the intermediate position to the second position and the second object holder is displaced by the first displacement unit from the intermediate position to the first position. Then the first process can be carried out with the second object holder in the first position and, simultaneously and independently, the second process can be carried out with the first object holder in the second position. Furthermore, as a result of the use of said two displacement units, a distance over which each individual displacement unit has to displace the object holders is reduced, so that the required dimensions of the displacement units are reduced. It is in addition prevented that the displaceable parts of the first displacement unit and the displaceable parts of the second displacement unit must be constructed so as to be capable of passing one another, which allows a comparatively simple construction of the displacement units.

The lithographic device according to the invention is for this purpose characterized in that the positioning device of the lithographic device is a positioning device according to the invention, wherein each of the object holders of the positioning device is a substrate holder of the lithographic device, and wherein the first position of the object holders is a characterization position which is present near the characterization unit. As a result of the use of the positioning device according to the invention in the lithographic device according to the invention, a characterization process involving a first series of positioning steps of the first substrate holder can be carried out in the first position by means of the first displacement unit of the positioning device, and an exposure process involving a second series of positioning steps of the second substrate holder can be carried out in the second position by means of the second displacement unit of the positioning device simultaneously with and independently from the first process. The first process can also be carried out with the second substrate holder in the first position and, simultaneously and independently, the second process can be carried out with the first object holder in the second position.

A particular embodiment of a positioning device according to the invention is characterized in that the displacement units each comprise an X-motor having a first part extending parallel to the X-direction and a second part which is displaceable along the first part of the X-motor and can be coupled alternately to the first object holder and to the second object holder, and two Y-motors each having a first part extending parallel to the Y-direction and a second part which is displaceable along the first part of the relevant Y-motor, the first part of the X-motor of each displacement unit being connected to the second parts of the two Y-motors of the relevant displacement unit. Since the first part of the X-motor of each displacement unit is connected to the second parts of the two Y-motors of the relevant displacement unit, a comparatively stiff and stable support of the X-motor by the two Y-motors is obtained, which benefits the positioning accuracy of the displacement unit. Since the first displacement unit has a limited displacing range from the first position to the intermediate position and the second displacement unit has a limited displacing range from the intermediate position to the second position, the four Y-motors of the two displacement units can be arranged in two lines, which leads to a compact and simple construction of the positioning device.

A further embodiment of a positioning device according to the invention is characterized in that the first parts of the Y-motors of the two displacement units are connected to a common balancing unit which is guided relative to a base of the positioning device so as to be displaceable parallel to the X-direction and parallel to the Y-direction and to be rotatable about an axis of rotation extending perpendicularly to the X-direction and the Y-direction. Since the first parts of the Y-motors of the displacement units are connected to said common balancing unit, reaction forces of the X-motors and the Y-motors of the displacement units are transmitted via the first parts of the Y-motors to the balancing unit and are converted into displacements of the balancing unit parallel to the X-direction and parallel to the Y-direction and rotations of the balancing unit about said axis of rotation relative to the base. In this manner, a transmission of the reaction forces to the base, the guiding surface, and the object holders is prevented as much as possible, so that the positioning accuracy of the positioning device is further improved.

A yet further embodiment of a positioning device according to the invention is characterized in that the object holders each comprise a basic part which is guided over the guiding surface and can be coupled to the displacement units, and an object table which is displaceable relative to the basic part by means of an actuator unit of the relevant object holder. In this yet further embodiment of the positioning device, the object tables of the object holders are displaceable by the displacement units over comparatively large distances and with comparatively low accuracies, while the object tables are displaceable by said actuator units over comparatively small distances and with comparatively high accuracies. In this manner, the displacement units can be of a relatively simple, conventional type, while the dimensions of the accurate actuator units can be limited as much as possible.

A particular embodiment of a positioning device according to the invention is characterized in that the object table of each of the object holders is displaceable relative to the basic part parallel to the X-direction, parallel to the Y-direction, and parallel to a Z-direction extending perpendicularly to the X-direction and the Y-direction, and is pivotable relative to the basic part about a first pivot axis extending parallel to the X-direction, a second pivot axis extending parallel to the Y-direction, and a third pivot axis extending parallel to the Z-direction. In this manner, a high degree of adjustability of the object tables relative to the basic parts is obtained.

BRIEF DESCRIPTION OF THE DRAWING

The invention will be explained in more detail below with reference to the drawing, in which FIG. 1 diagrammatically shows a lithographic device according to the invention.

DESCRIPTION OF THE PREFERRED EMBODIMENTS

Figure 1:
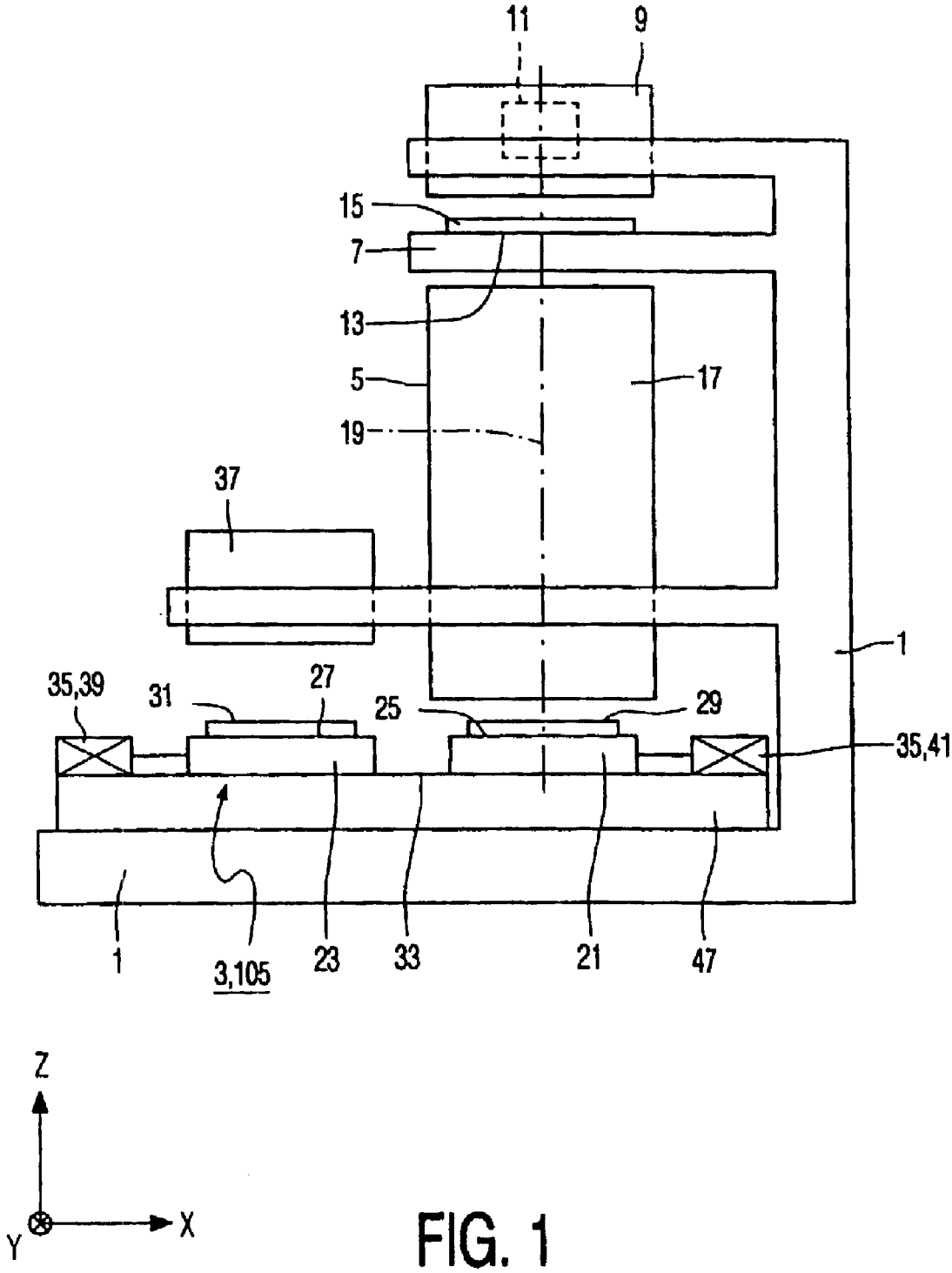

The lithographic device according to the invention shown diagrammatically in FIG. 1 is used for the exposure of semiconductor substrates in the manufacturing process of integrated semiconductor circuits and comprises a frame 1 which supports in that order, as seen parallel to a vertical Z-direction, a positioning device 3 according to the invention, a focusing unit 5, a mask holder 7, and a radiation source 9. The lithographic device is an optical lithographic device whose radiation source 9 comprises a light source 11. The mask holder 7 comprises a support surface 13 which extends perpendicularly to the Z-direction and on which a mask 15 can be placed comprising a pattern or a sub-pattern of an integrated semiconductor circuit. The focusing unit 5 is an imaging or projection system and comprises an optical lens system 17 having a main optical axis 19 extending parallel to the Z-direction and an optical reduction factor of, for example, 4 or 5. The positioning device 3 comprises a first substrate holder 21 and a second substrate holder 23 which is identical to the first substrate holder 21. The substrate holders 21, 23 each comprise a support surface 25, 27 which extends perpendicularly to the Z-direction. In the situation shown in FIG. 1, a first semiconductor substrate 29 is present on the support surface 25 of the first substrate holder 21 and a second semiconductor substrate 31 is present on the support surface 27 of the second substrate holder 23. The positioning device 3 further comprises a guiding surface 33 extending parallel to a horizontal X-direction which is perpendicular to the Z-direction and parallel to a horizontal Y-direction which is perpendicular to the X-direction and the Z-direction. The substrate holders 21, 23 are each guided over the guiding surface 33 and are each displaceable over the guiding surface 33 parallel to the X-direction and parallel to the Y-direction by means of a displacement system 35 of the positioning device 3.

In the situation shown in FIG. 1, the first substrate holder 21 with the first semiconductor substrate 29 is in a second position of the positioning device 3 which corresponds to an exposure position of the lithographic device which is present near the focusing unit 5. In this position, a light beam originating from the light source 11 is guided through the mask 15 and is focused on the first semiconductor substrate 29 by means of the focusing unit 5, so that the pattern present on the mask 15 is imaged on a reduced scale on the first semiconductor substrate 29. The first semiconductor substrate 29 comprises a large number of individual fields on which identical semiconductor circuits are to be imaged. The fields of the first semiconductor substrate 29 are consecutively exposed through the mask 15 for this purpose. The exposure process used in the lithographic device of FIG. 1 is a so called step-and-repeat exposure process according to which the first semiconductor substrate 29 and the mask 15 are in fixed positions relative to the focusing unit 5 during the exposure of an individual field of the first semiconductor substrate 29, and according to which a next field of the first semiconductor substrate 29 is brought into position relative to the focusing unit 5 after the exposure of a previously exposed field in that the first substrate holder 21 is displaced parallel to the X-direction and/or parallel to the Y-direction by the displacement system 35 of the positioning device 3. This process is repeated a number of times, with a different mask each time, so that complicated integrated semiconductor circuits with a layered structure can be manufactured.

In the situation shown in FIG. 1, the second substrate holder 23 with the second semiconductor substrate 31 is in a first position of the positioning device 3 which corresponds to a characterization position of the lithographic device. In the situation shown, a previous semiconductor substrate, which was fully exposed in the exposure position via the mask 15, was unloaded from the second substrate holder 23 and was transported to a stack of semiconductor substrates under manufacture not shown in the figure. The second semiconductor substrate 31 shown in FIG. 1 is a next semiconductor substrate which has just been taken from said stack of semiconductor substrates and loaded on the second substrate holder 23 and which has to be exposed via the mask 15 after the first semiconductor substrate 29. In the characterization position, the second semiconductor substrate 31 is characterized by a characterization unit 37 of the lithographic device which is also supported by the frame 1. When the second semiconductor substrate 31 has been fully characterized and the first semiconductor substrate 29 has been fully exposed, the second substrate holder 23 with the second semiconductor substrate 31 is displaced by the displacement system 35 from the characterization position into the exposure position and the first substrate holder 21 with the first semiconductor substrate 29 is displaced by the displacement system 35 from the exposure position into the characterization position. The characterization unit 37 comprises, for example, a measuring system which is used for measuring the positions of the individual fields of the second semiconductor substrate 31 relative to the second substrate holder 23. Since these positions are already measured in the characterization position, the individual fields of the second semiconductor substrate 31 can subsequently be positioned relative to the focusing unit 5 in the exposure position by measuring the position of the second substrate holder 23 relative to the focusing unit 5. In this manner, the time required to position the individual fields of the successive semiconductor substrates relative to the focusing unit 5 in the exposure position is limited considerably, so that the throughput of the lithographic device is considerably improved. Since the position of each individual field of the second semiconductor substrate 31 has to be measured in the characterization position, a step wise displacement of the second substrate holder 23 with the second semiconductor substrate 31 is carried out by the displacement system 35 of the positioning device 3 in the characterization position. As a result of the use of the two separate identical substrate holders 21 and 23, the exposure process of a semiconductor substrate in the exposure position can be carried out simultaneously with the unload process of a previous semiconductor substrate and the load and characterization processes of a next semiconductor substrate in the characterization position, so that the throughput of the lithographic device is further improved.

Figure 2:
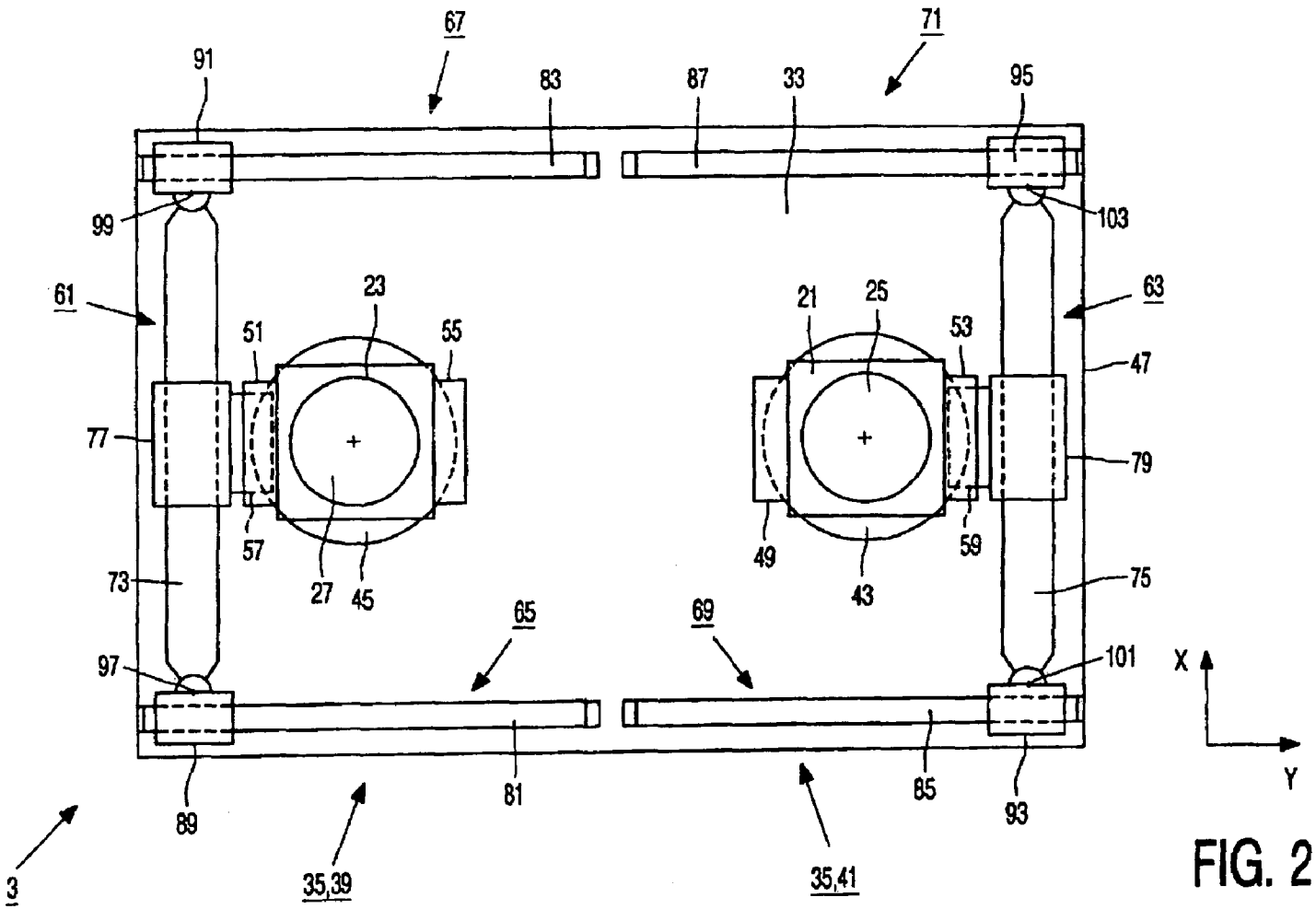
FIG. 2 is a diagrammatic plan view of a first embodiment of a positioning device according to the invention suitable for use in the lithographic device of FIG. 1.

As shown in FIG. 2, the displacement system 35 of the positioning device 3 comprises a first displacement unit 39 and a second displacement unit 41. The substrate holders 21, 23 each comprise an aerostatically supported foot 43, 45 provided with a static gas bearing by means of which the relevant substrate holder 21, 23 is guided over the guiding surface 33. The guiding surface 33 constitutes an upper surface of a granite block 47 which is fastened to the frame 1 of the lithographic device. Furthermore, the substrate holders 21, 23 each comprise a first coupling member 49, 51 and a second coupling member 53, 55 by means of which the substrate holders 21, 23 can be coupled alternately to a coupling member 57 of the first displacement unit 39 and to a coupling member 59 of the second displacement unit 41, respectively. In the situation shown in FIG. 2, the first substrate holder 21 is coupled to the coupling member 59 of the second displacement unit 41 and the second substrate holder 23 is coupled to the coupling member 57 of the first displacement unit 39. Alternatively, the first substrate holder 21 can be coupled to the coupling member 57 of the first displacement unit 39 and the second substrate holder 23 can be coupled to the coupling member 59 of the second displacement unit 41. The coupling members 49, 51, 53, 55, 57, 59 may be of a type which is known and usual per se, such as, for example, a mechanical or an electromechanical coupling member.

As FIG. 2 shows, the first displacement unit 39 and the second displacement unit 41 each comprise a linear X-motor 61, 63 and two linear Y-motors 65, 67, 69, 71 of a conventional type which is known and usual per se. The X-motors 61, 63 each comprise a first part 73, 75 extending parallel to the X-direction and a second part 77, 79 which is displaceable along the first part 73, 75 of the relevant X-motor 61, 63 and comprises the coupling member 57, 59 of the relevant X-motor 61, 63. The Y-motors 65, 67, 69, 71 each comprise a first part 81, 83, 85, 87 extending parallel to the Y-direction and a second part 89, 91, 93, 95 which is displaceable along the first part 81, 83, 85, 87 of the relevant Y-motor 65, 67, 69, 71. The X-motor 61 and the two Y-motors 65, 67 of the first displacement unit 39 are mutually arranged in a H-configuration, a first end 97 and a second end 99 of the first part 73 of the X-motor 61 being coupled to the second part 89 of the Y-motor 65 and to the second part 91 of the Y-motor 67, respectively. Likewise, the X-motor 63 and the two Y-motors 69, 71 of the second displacement unit 41 are mutually arranged in a H-configuration, a first end 101 and a second end 103 of the first part 75 of the X-motor 63 being coupled to the second part 93 of the Y-motor 69 and to the second part 95 of the Y-motor 71, respectively.

Figure 3:
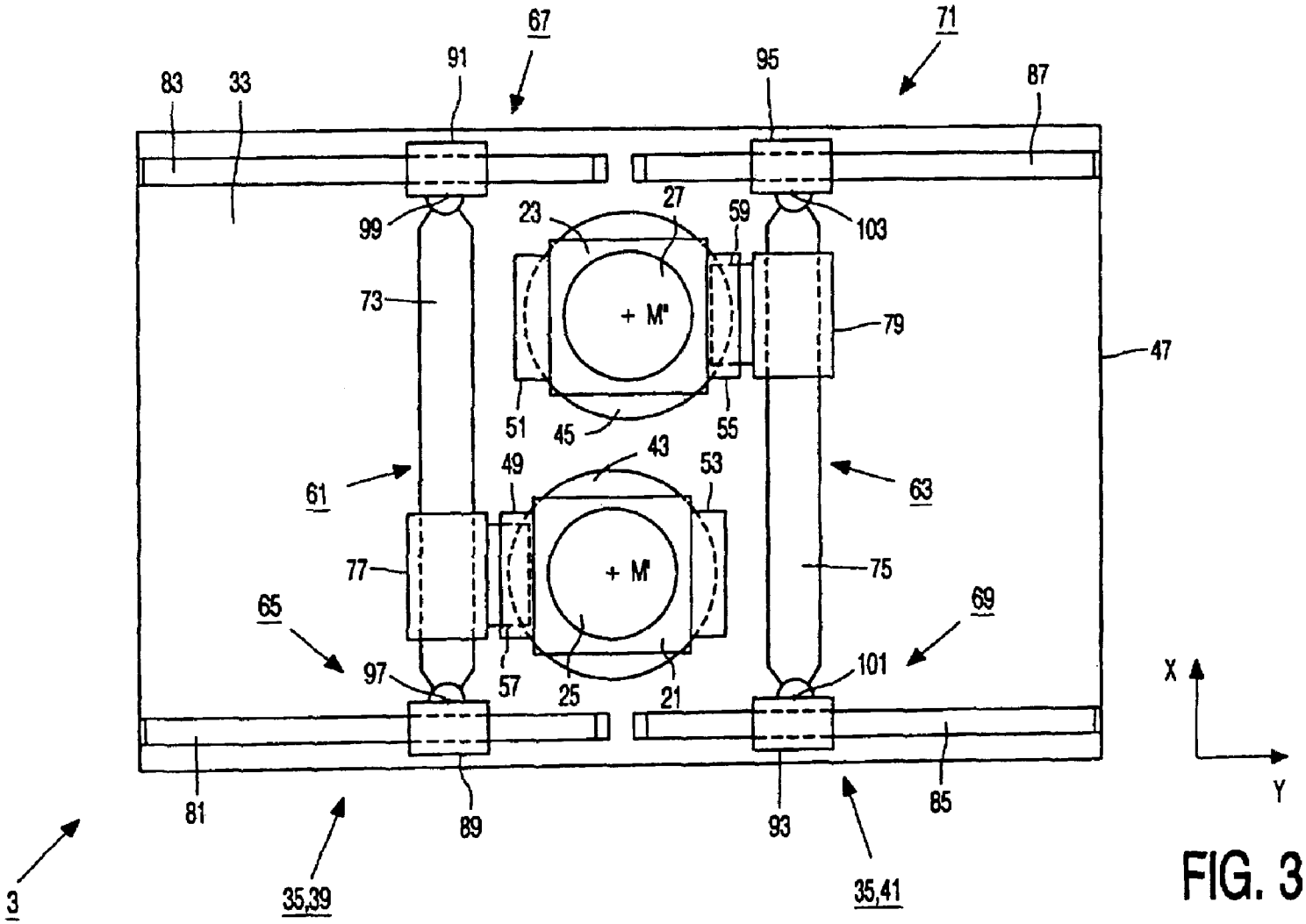
FIG. 3 shows the positioning device of FIG. 2, two substrate holders of the positioning device being in an intermediate position.

In the situation shown in FIG. 2, the second substrate holder 23 is in the first position or characterization position and a characterization process involving a first series of positioning steps of the second substrate holder 23 is carried out by means of the first displacement unit 39. Simultaneously, the first substrate holder 21 is in the second position or exposure position and an exposure process involving a second series of positioning steps of the first substrate holder 21 is carried out by means of the second displacement unit 41. Thus, as a result of the use of the first displacement unit 39 and the second displacement unit 41, the characterization process can be carried out not only simultaneously with but also independently from the exposure process. When the exposure process with the first substrate holder 21 and the characterization process with the second substrate holder 23 have been completed, the first substrate holder 21 is displaced by means of the second displacement unit 41 from the exposure position into an intermediate position M' between the exposure position and the characterization position as shown in FIG. 3, and the second substrate holder 23 is displaced by means of the first displacement unit 39 from the characterization position into an intermediate position M" between the exposure position and the characterization position. In said intermediate positions M' and M", the second coupling member 53 of the first substrate holder 21 is uncoupled from the coupling member 59 of the second displacement unit 41 and the first coupling member 51 of the second substrate holder 23 is uncoupled from the coupling member 57 of the first displacement unit 39. Subsequently, the coupling member 57 of the first displacement unit 39 is coupled to the first coupling member 49 of the first substrate holder 21 and the coupling member 59 of the second displacement unit 41 is coupled to the second coupling member 55 of the second substrate holder 23, as shown in FIG. 3. Then, the first substrate holder 21 is displaced by the first displacement unit 39 from the intermediate position M' into the characterization position where the substrate present on the first substrate holder 21 is unloaded and a next substrate is loaded and characterized. Simultaneously therewith and independently therefrom, the second substrate holder 23 is displaced by the second displacement unit 41 from the intermediate position M" into the exposure position where the substrate present on the second substrate holder 23 is exposed. Since the first displacement unit 39 is suitable for displacing both substrate holders 21 and 23 from the first position or characterization position into the intermediate positions M' and M" and the second displacement unit 41 is suitable for displacing both substrate holders 21 and 23 from the intermediate positions M' and M" into the exposure position, a distance over which each displacement unit 39, 41 must be able to displace the substrate holders 21 and 23 is reduced, so that the required dimensions of the displacement units 39, 41 are reduced. As FIG. 2 shows, particularly the dimensions of the Y-motors 65, 67, 69, 71 of the displacement units 39, 41 are considerably reduced as seen parallel to the Y-direction. Furthermore, the use of the two displacement units 39, 41 prevents that the displaceable parts of the displacement system 35, in particular the X-motors 61 and 63, must be constructed so as to be capable of passing one another, as a result of which a comparatively simple construction of the displacement system 35 is achieved. The arrangement of the two X-motors 61, 63 and the four Y-motors 65, 67, 69, 71 in two H-configurations leads to a comparatively stiff and stable support of X-motors 61, 63 by the relevant Y-motors 65, 67, 69, 71, which benefits the positioning accuracy of the displacement units 39, 41. The limited displacing range of the displacement units 39, 41 as seen parallel to the Y-direction enables the mutual arrangement of the four Y-motors 65, 67, 69, 71 in two lines of two Y-motors 65, 69 and 67, 71 each, which leads to a compact and simple construction of the positioning device 3.

Figure 4:
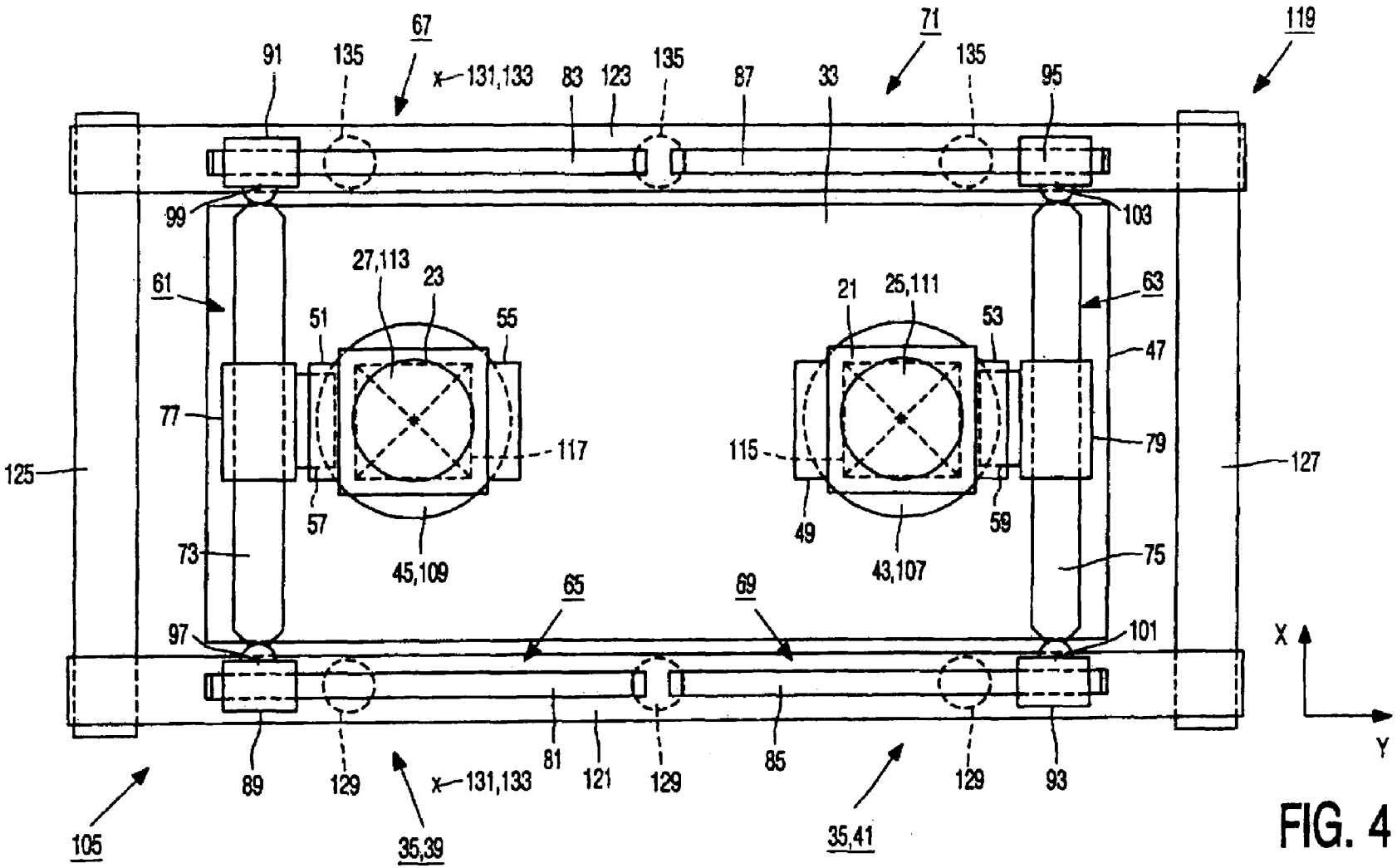
FIG. 4 is a diagrammatic plan view of a second embodiment of a positioning device according to the invention suitable for use in the lithographic device of FIG. 1.

FIG. 4 shows a second embodiment of a positioning device 105 according to the invention suitable for use in the lithographic device according to the invention. Corresponding parts of the first embodiment of the positioning device 3 and the second embodiment of the positioning device 105 are indicated by means of corresponding reference numerals in FIGS. 2, 3, and 4. Hereafter, only the main differences between the positioning devices 3 and 105 will be discussed.

The substrate holders 21 and 23 of the positioning device 105 each comprise a basic part 107, 109 which comprises the aerostatically supported foot 43, 45, the first coupling member 49, 51, and the second coupling member 53, 55 of the relevant substrate holder 21, 23. Furthermore, the substrate holders 21, 23 of the positioning device 105 each comprise a substrate table 111, 113 which comprises the support surface 25, 27 of the relevant substrate holder 21, 23. The substrate holders 21, 23 each comprise ah actuator unit 115, 117 which is indicated diagrammatically only in FIG. 4 and by means of which the substrate table 111, 113 of the relevant substrate holder 21, 23 is displaceable relative to the basic part 107, 109 of the relevant substrate holder 21, 23. In the second embodiment of the positioning device 105 according to the invention, the actuator units 115, 117 each comprise a system of contactless Lorentz-force motors which are known and usual per se and by means of which the substrate table 111, 113 of the relevant substrate holder 21, 23 is displaceable relative to the basic part 107, 109 of the relevant substrate holder 21, 23 with comparatively high accuracies and over comparatively small distances in directions parallel to the X-direction, parallel to the Y-direction, and parallel to the Z-direction, and by means of which the substrate table 111, 113 of the relevant substrate holder 21, 23 is pivotable relative to the basic part 107, 109 of the relevant substrate holder 21, 23 with comparatively high accuracies and over comparatively small angles about a first pivot axis extending parallel to the X-direction, a second pivot axis extending parallel to the Y-direction, and a third pivot axis extending parallel to the Z-direction. In this manner, the displacement units 39, 41 each constitute a so called coarse-fine displacement unit wherein the substrate holders 21, 23 with the substrate tables 111, 113 are displaceable over comparatively large distances and with comparatively low accuracies by means of the X-motors 61, 63 and the Y-motors 65, 67, 69, 71 of the displacement units 39, 41, and wherein the substrate tables 111, 113 are displaceable and pivotable with comparatively high accuracies and over comparatively low distances and small angles relative to the basic parts 107, 109 of the substrate holders 21, 23 by means of the actuator units 115, 117 of the displacement units 39, 41. In this manner, the X-motors 61, 63 and the Y-motors 65, 67, 69, 71 can be of a relatively simple, conventional, and low-cost type, while the required dimensions and therefore the costs of the accurate and advanced actuator units 115, 117 can be limited as much as possible. The use of the actuator units 115, 117 as described further provides a high degree of adjustability of the substrate tables 111, 113 relative to the focusing unit 5 and relative to the characterization unit 37 of the lithographic device.

As FIG. 4 further shows, the first parts 81, 83, 85, 87 of the Y-motors 65, 67, 69, 71 of the displacement units 39, 41 of the positioning device 105 are fastened to a balancing unit 119 which is common for the two displacement units 39, 41. The balancing unit 119 comprises a first beam 121 which extends substantially parallel to the Y-direction and to which the first part 81 of the Y-motor 65 of the first displacement unit 39 and the first part 85 of the Y-motor 69 of the second displacement unit 41 are fastened, and a second beam 123 which also extends substantially parallel to the Y-direction and to which the first part 83 of the Y-motor 67 of the first displacement unit 39 and the first part 87 of the Y-motor 71 of the second displacement unit 41 are fastened. The first beam 121 and the second beam 123 are interconnected by means of a first cross-beam 125 and a second cross-beam 127, the beams 121 and 123 and the cross-beams 125 and 127 being arranged in a rectangular configuration which surrounds the granite block 47 carrying the guiding surface 33. As FIG. 4 diagrammatically shows, the first beam 121 of the balancing unit 119 is guided by means of static gas bearings 129 over a further guiding surface 131 which is provided on a base 133 of the positioning device 105 and extends parallel to the X-direction and parallel to the Y-direction, and the second beam 123 of the balancing unit 119 is guided by means of static gas bearings 135 over said further guiding surface 131. Thus, the balancing unit 119 is displaceable in direction parallel to the X-direction and parallel to the Y-direction and is rotatable about an axis of rotation extending parallel to the Z-direction. In operation, reaction forces of the actuator units 115, 117 of the displacement units 39, 41 directed parallel to the X-direction and/or parallel to the Y-direction are transmitted via the X-motors 61, 63 and the Y-motors 65, 67, 69, 71 to the balancing unit 119, reaction forces of the X-motors 61, 63 of the displacement units 39, 41 directed parallel to the X-direction and/or parallel to the Y-direction are transmitted via the Y-motors 65, 67, 69, 71 to the balancing unit 119, and reaction forces of the Y-motors 65, 67, 69, 71 of the displacement units 39, 41 directed parallel to the X-direction and/or parallel to the Y-direction are directly transmitted to the balancing unit 119. Since the balancing unit 119 is guided over the further guiding surface 131 by means of the static gas bearings 129, 135, said reaction forces are substantially completely converted into relatively small displacements of the balancing unit 119 in directions parallel to the X-direction and/or parallel to the Y-direction and into relatively small rotations of the balancing unit 119 about said axis of rotation extending parallel to the Z-direction. In this manner, mechanical vibrations, which may be caused by said reaction forces in the base 133 and which may be transmitted to the granite block 47 and the substrate holders 21, 23 of the lithographic device 105 and to the frame 1 of the lithographic device, are prevented as much as possible, so that the positioning accuracy of the displacement system 35 of the positioning device 105 is further improved.

It is noted that another type of displacement unit may be used in the positioning device according to the invention instead of the displacement units 39, 41 used in the positioning devices 3, 105 described before. For example, the displacement units of the positioning device may each alternatively comprise a single linear X-motor and a single linear Y-motor for large-distance displacements of the relevant object holder and an actuator unit solely comprising an X-Lorentz-force motor and a Y-Lorentz-force motor for small-distance displacements of the relevant object table.

It is further noted that the invention also relates to lithographic devices in which an exposure process following the step-and-scan principle is applied. Such a lithographic device is provided with a further positioning device by means of which the mask holder is displaceable in a scan direction which is parallel to, for example, the X-direction. According to the stepand-scan process, the mask and the semiconductor substrate are not in fixed positions relative to the focusing unit during the exposure process but are displaced simultaneously in the scan direction, so that the pattern present on the mask is scanned.

It is finally noted, that a positioning device according to the invention may be used not only in a lithographic device but also in other devices where two object tables have to perform a series of positioning steps simultaneously and independently from each other. Examples are finishing machines, machine tools, and other machines or devices in which an object to be machined or processed is first characterized relative to an object holder in a characterization position and is subsequently machined or processed in an operational position.

What is claimed is:

1. A positioning device for a lithographic apparatus, comprising:

a guiding surface extending parallel to an X-direction and parallel to a Y-direction;

a first object holder and a second object holder which are each adapted to be guided over the guiding surface and are each displaceable parallel to the X-direction and parallel to the Y-direction from a first position into a second position; and a displacement system constructed and arranged to displace the first object holder and the second object holder over the guiding surface, wherein the displacement system comprises a first displacement unit and a second displacement unit to which the first object holder, and the second object holder can be coupled alternately, the first displacement unit being suitable for displacing the object holders from the first position into an intermediate position between the first position and the second position, and the second displacement unit being suitable for displacing the object holders from the intermediate position into the second position.

2. A positioning device as claimed in claim 1, wherein the first and second displacement units each comprise an X-motor having a first part extending parallel to the X-direction and a second part which is displaceable along the first part of the X-motor and can be coupled alternately to the first object holder and to the second object holder, and two Y-motors each having a first part extending parallel to the Y-direction and a second part which is displaceable along the first part of the relevant Y-motor, the first part of the X-motor of each displacement unit being connected to the second parts of the two Y-motors of the relevant displacement unit.

3. A positioning device as claimed in claim 2, wherein the first parts of the Y-motors of the two displacement units are connected to a common balancing unit which is guided relative to a base of the positioning device so as to be displaceable parallel to the X-direction and parallel to the Y-direction and to be rotatable about an axis of rotation extending perpendicularly to the X-direction and the Y-direction.

4. A positioning device as claimed in claim 1, wherein the object holder each comprise a basic part which is guided over the guiding surface and adapted to be coupled to the displacement units, and an object table which is displaceable relative to the basic part by an actuator unit of the relevant object holder.

5. A positioning device as claimed in claim 4, wherein the object table of each of the object holders is displaceable relative to the basic part parallel to the X-direction, parallel to the Y-direction, and parallel to a Z-direction extending perpendicularly to the X-direction and the Y-direction, and is pivotable relative to the basic part about a first pivot axis extending parallel to the X-direction, a second pivot axis extending parallel to the Y-direction, and a third pivot axis extending parallel to the Z-direction.

6. A positioned device as claimed in claim 1, wherein said first and second object holders are first and second substrate holders, respectively.

7. A lithographic device comprising:

a radiation source;

a mask [bolder] *holder*;

a focusing unit having a main axis;

a characterization unit; and a positioning device comprising:

a guiding surface extending parallel to an X-direction, which is perpendicular to the main axis, and parallel to a Y-direction, which is perpendicular to the X-direction and this main axis, a first substrate holder and a second substrate holder which are each guided over the guiding surface and are each displaceable parallel to the X-direction and parallel to the Y-direction from a first position into a second position which is near the focusing unit, and a displacement system constructed and arranged to displace the first substrate [bolder] *holder* and the second substrate holder over the guiding surface, wherein the displacement system comprises a first displacement unit and a second displacement unit to which the first substrate holder and second substrate holder can be coupled alternately, the first displacement unit being suitable for displacing the substrate holders from the first position into an intermediate position between the first position and the second position, and the second displacement unit being suitable for displacing the substrate holders from the intermediate position into the second position, and wherein the first position of the substrate holders is a characterization position which is present near the characterization unit.

8. A lithographic device as claimed in claim 7, wherein the first and second displacement units each comprise an X-motor having a first part extending parallel to the X-direction and a second part which is displaceable along the first part of the X-motor and can be coupled alternately to the first substrate holder and to the second substrate holder, and two Y-motors each having a first part extending parallel to the Y-direction and a second part which is displaceable along the first part of the relevant Y-motor, the first part of the X-motor of each displacement unit being connected to the second parts of the two Y-motors of the relevant displacement unit.

9. A lithographic device as claimed in claim 8, wherein the first parts of the Y-motors of the two displacement units are connected to a common balancing unit which is guided relative to a base of the positioning device so as to be displaceable parallel to the X-direction and parallel to the Y-direction and to be rotatable about an axis of rotation extending perpendicularly to the X-direction and the Y-direction.

10. A lithographic device as claimed in claim 7, wherein the substrate holders each comprise a basic part which is guided over the guiding surface and can be coupled to the displacement units, and a substrate table which is displaceable relative to the basic part by means of an actuator unit of the relevant substrate holder.

11. A lithographic device as claimed in claim 10, wherein the substrate table of each of the substrate holders is displaceable relative to the basic part parallel to the X-direction, parallel to the Y-direction, and parallel to the Z-direction extending perpendicularly to the X-direction and the Y-direction, and is pivotable relative to the basic part about a first pivot axis extending parallel to the X-direction, a second pivot axis extending parallel to the Y-direction, and a third pivot axis extending parallel to the Z-direction.

*12. A positioning device for a lithographic apparatus, comprising:*

*a guiding surface extending parallel to an X-direction and parallel to a Y-direction;*

*a first object holder and a second object holder which are each adapted to be guided over the guiding surface and are each displaceable parallel to the X-direction and parallel to the Y-direction from a first position into a second position;*

*a displacement system constructed and arranged to displace the first object holder and the second object holder over the guiding surface;*

*wherein the displacement system comprises a first displacement unit and a second displacement unit to which the first object holder and the second object holder can be coupled alternately so that the first object holder and the second object holder switch positions;*

*wherein the first and second displacement units each comprise an X-motor having a first part extending parallel to the X-direction and a second part which is displaceable along the first part of the X-motor and can be coupled alternately to the first object holder and to the second object holder, and two Y-motors each having a first part extending parallel to the Y-direction and a second part which is displaceable along the first part of the relevant Y-motor, the first part of the X-motor of each displacement unit being connected to the second parts of the two Y-motors of the relevant displacement unit; and*

*wherein the first parts of the Y-motors of the two displacement units are connected to a common balancing unit which is guided relative to a base of the positioning device so as to be displaceable parallel to the X-direction and parallel to the Y-direction and to be rotatable about an axis of rotation extending perpendicularly to the X-direction and the Y-direction.*

*13. A positioning device for a lithographic apparatus, comprising:*

*a guiding surface extending parallel to an X-direction and parallel to a Y-direction;*

*a first object holder and a second object holder which are each adapted to be guided over the guiding surface and are each displaceable parallel to the X-direction and parallel to the Y-direction from a first position into a second position;*

*a displacement system constructed and arranged to displace the first object holder and the second object holder over the guiding surface;*

*wherein the displacement system comprises a first displacement unit and a second displacement unit to which the first object holder and the second object holder can be coupled alternately so that the first object holder and the second object holder switch positions;*

*wherein the object holders each comprise a basic part which is guided over the guiding surface and adapted to be coupled to the displacement units, and an object table which is displaceable relative to the basic part by an actuator unit of the relevant object holder; and*

*wherein the object table of each of the object holders is displaceable relative to the basic part parallel to the X-direction, parallel to the Y-direction, and parallel to a Z-direction extending perpendicularly to the X-direction and the Y-direction, and is pivotable relative to the basic part about a first pivot axis extending parallel to the X-direction, a second pivot axis extending parallel to the Y-direction, and a third pivot axis extending parallel to the Z-direction.*

*14. A positioning device for a lithographic apparatus, comprising:*

*a guiding surface extending parallel to an X-direction and parallel to a Y-direction;*

*a first object holder and a second object holder which are each adapted to be guided over the guiding surface and are each displaceable parallel to the X-direction and parallel to the Y-direction from a first position into a second position;*

*a displacement system constructed and arranged to displace the first object holder and the second object holder over the guiding surface;*

*wherein the displacement system comprises a first displacement unit and a second displacement unit to which the first object holder and the second object holder can be coupled alternately so that the first object holder and the second object holder switch positions; and*

*wherein said first and second object holders are first and second substrate holders, respectively.*

*15. A positioning method for performing operations on substrates in a lithographic device, comprising:*

*moving first and second substrate holders over a two-dimensional plane between a first position into a second position with first and second displacement units;*

*loading and characterizing a substrate in the first position;*

*exposing and unloading the substrate in the second position;*

*the first and second displacement units moving the first substrate holder and the second substrate holder over the guiding surface between the first and second positions using connections that can be coupled and uncoupled so that the substrate holders switch positions.*

* * * * *